US010938404B1

(12) United States Patent
Sanchez et al.

(10) Patent No.: US 10,938,404 B1
(45) Date of Patent: Mar. 2, 2021

(54) DIGITAL-TO-ANALOG CONVERTER, TRANSMITTER, BASE STATION AND MOBILE DEVICE

(71) Applicant: Intel Corporation, Santa Clara, CA (US)

(72) Inventors: Ramon Sanchez, Madrid (ES); Kameran Azadet, San Ramon, CA (US); Martin Clara, Santa Clara, CA (US); Daniel Gruber, St. Andrae (AT)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/728,163

(22) Filed: Dec. 27, 2019

(51) Int. Cl.
*H03M 1/66* (2006.01)
*H03K 3/84* (2006.01)
*G06F 7/58* (2006.01)
*H04B 1/40* (2015.01)
*H04W 88/08* (2009.01)

(52) U.S. Cl.
CPC .............. *H03M 1/66* (2013.01); *G06F 7/584* (2013.01); *H03K 3/84* (2013.01); *H04B 1/40* (2013.01); *H04W 88/08* (2013.01)

(58) Field of Classification Search
CPC ............ H03M 1/66; H03K 3/84; G06F 7/584; H04B 1/40
See application file for complete search history.

(56) References Cited

U.S. PATENT DOCUMENTS 7,095,347 B2 * 8/2006 Hirata ....................... G05F 3/22
341/144
7,782,236 B2 * 8/2010 Kim ...................... H03K 17/145
341/136
9,379,883 B1 * 6/2016 Kuttner ............... H03M 1/0863

* cited by examiner

*Primary Examiner* — Brian K Young
(74) *Attorney, Agent, or Firm* — 2SPL Patent Attorneys PartG mbB; Yong Beom Hwang

(57) ABSTRACT

A digital-to-analog converter is provided. The digital-to-analog converter comprises an input configured to receiving a first digital control code for controlling a plurality of digital-to-analog converter cells. Further, the digital-to-analog converter comprises a code converter circuit configured to converter the first digital control code to a second digital control code. Further, the digital-to-analog converter comprises a shift code generation circuit configured to generate a shift code based on a code difference between the first digital control code and a third digital control code. The digital-to-analog converter additionally comprises a bit-shifter circuit configured to bit-shift the second digital control code based on the shift code in order to obtain a modified second digital control code. The digital-to-analog converter comprises a cell activation circuit configured to selectively activate one or more of the plurality of digital-to-analog converter cells based on the modified second digital control code. Each activated digital-to-analog converter cell is configured to output a respective cell output signal. Further, the digital-to-analog converter comprises an output configured to output an analog output signal based on the cell output signals.

24 Claims, 12 Drawing Sheets

Initial State, n

$R_0(n)$  $p_0(n)=7$
| 0 | 0 | 0 | 0 | 0 | 0 | 0 | 1 | 1 | 1 | 1 | 1 | 1 | 1 |

$R_1(n)$  $p_1(n)=10$
| 1 | 1 | 1 | 1 | 1 | 1 | 1 | 1 | 1 | 1 | 0 | 0 | 0 | 0 |

$T(n) = R_0(n)$ AND $R_1(n)$
| 0 | 0 | 0 | 0 | 0 | 0 | 0 | 1 | 1 | 1 | 0 | 0 | 0 | 0 |   $x(n)=3$

State n+1

$R_0(n+1)$  $p_0(n+1)=7$
| 0 | 0 | 0 | 0 | 0 | 0 | 0 | 1 | 1 | 1 | 1 | 1 | 1 | 1 |

$R_1(n+1)$  $p_1(n+1)=12$
| 1 | 1 | 1 | 1 | 1 | 1 | 1 | 1 | 1 | 1 | 1 | 1 | 0 | 0 |

$T(n+1) = R_0(n+1)$ AND $R_1(n+1)$
| 0 | 0 | 0 | 0 | 0 | 0 | 0 | 1 | 1 | 1 | 1 | 1 | 0 | 0 |   $x(n+1)=5$

State n+2

DIGITAL-TO-ANALOG CONVERTER, TRANSMITTER, BASE STATION AND MOBILE DEVICE

FIELD

The present disclosure relates to a Digital-to-Analog Converter (DAC). In particular, examples relate to DACs, a transmitter, a base station and a mobile device.

BACKGROUND

In thermometer encoded DAC architectures, C cells are activated when a digital code C is requested. Since the cells are in practice not identical, the DAC output may include an error. If the selection of cells is fixed for each digital code, the error is systematic and may translate into harmonic distortions.

Hence, there may be a desire for an improved DAC.

BRIEF DESCRIPTION OF THE FIGURES

Some examples of apparatuses and/or methods will be described in the following by way of example only, and with reference to the accompanying figures, in which

FIG. 6 illustrates an exemplary progression of digital codes;

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled via one or more intervening elements. If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two Elements.

The terminology used herein for the purpose of describing particular examples is not intended to be limiting for further examples. Whenever a singular form such as "a", "an" and "the" is used and using only a single element is neither explicitly nor implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises", "comprising", "includes" and/or "including", when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
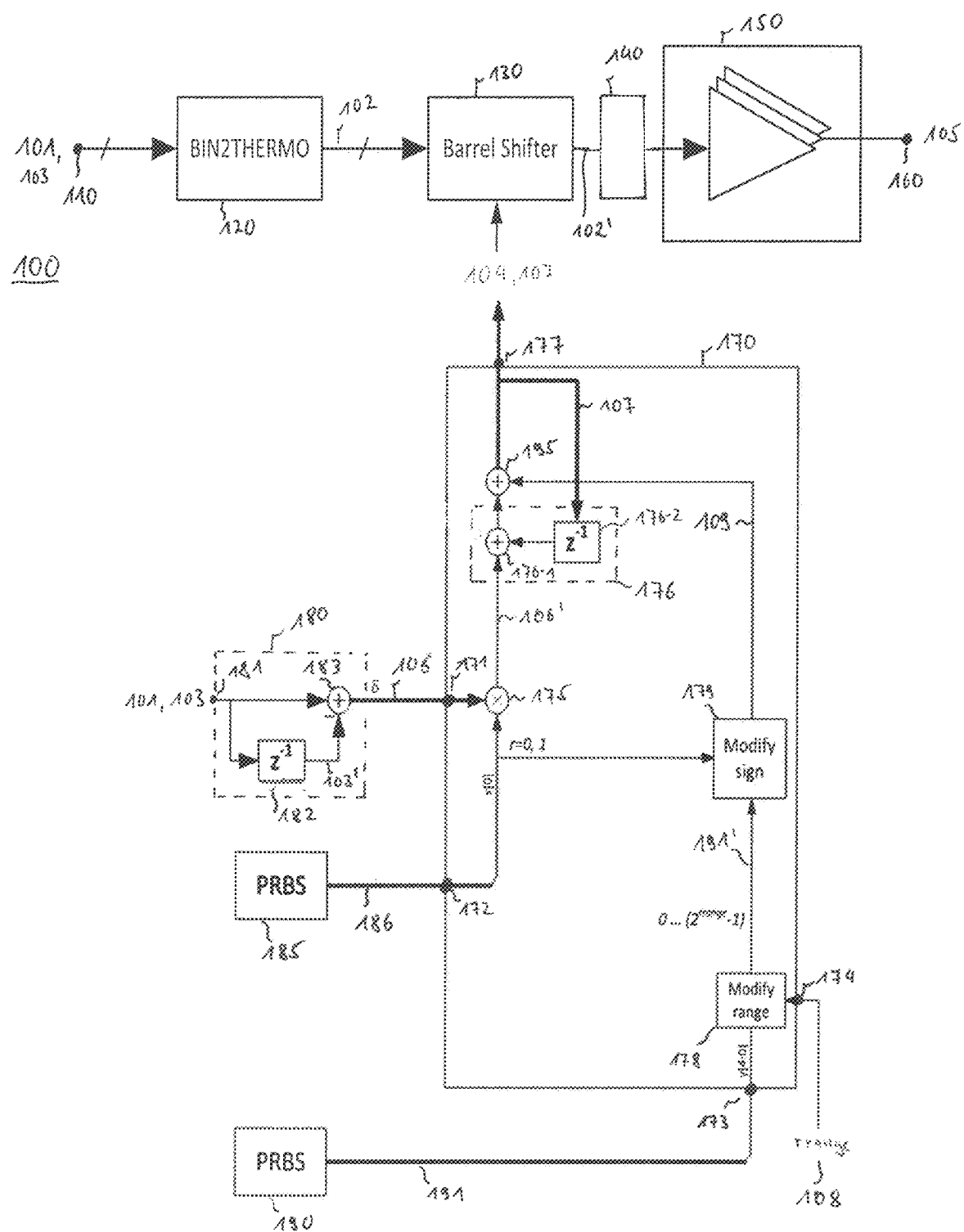
FIG. 1 illustrates a first example of a DAC.

FIG. 1 illustrates an example of a DAC 100. The DAC 100 comprises an input (node) 110 configured to receive a first digital control code 101 for controlling a plurality of DAC cells 150 (i.e. a number of L≥2 DAC cells). Further, the DAC 100 comprises a code converter circuit 120 configured to convert the first digital control code 101 to a second digital control code 102. For example, the first digital control code may be a binary code, and the second digital control code 102 may be a unary code.

A bit-shifter circuit 130 (e.g. a barrel shifter circuit) of the DAC 100 is configured to bit-shift the second digital control code 102 based on a shift code 104 in order to obtain a modified second digital control code 102'. The DAC 100 comprises a cell activation circuit 140 configured to selectively activate one or more of the plurality of DAC cells 150 based on the modified second digital control code 102'. Each activated DAC cell is configured to output a respective cell output signal. For example, based on the modified second digital control code 102', the cell activation circuit 140 may be configured to generate and supply one or more respective activation/drive signals to the plurality of DAC cells 150 for activating and/or driving one or more of the plurality of DAC cells 150. An output (node) 160 of the DAC 100 is configured to output an analog output signal 105 based on the cell output signals of the activated DAC cells.

The DAC 100 comprises a shift code generation circuit 170 configured to generate the shift code 104 based on a code difference between the first digital control code 101 and a third digital control code 103. The input 110 is configured to receive the third digital control code 103 prior to the first digital control code 101. In other words, third digital control code 103 and the first digital control code 101 are (timewise) succeeding digital control codes for selectively controlling activation of the plurality of DAC cells 150. For example, the third digital control code 103 may be a binary code like the first digital control code 101.

By shifting the second digital control code 102 based on the shift code 104, the correlation between the input first digital control code 101 and the activated (selected) DAC cells may be reduced. Accordingly, harmonic distortion and noise may be reduced in the analog output signal 105 of the DAC 100. As will become more evident from the following explanations, the implementation of the shift code generation circuit 170 may be simplified.

A code difference determination circuit 180 of the DAC 100 is configured to determine, based on the first digital control code 101 and the third digital control code 103, a binary difference sequence 106 that indicates the code difference between the first digital control code 101 and the third digital control code 103. In the example of FIG. 1, the code difference determination circuit 180 comprises a circuit input (node) 181 configured to subsequently receive the first digital control code 101 and the third digital control code 103 (e.g. the third digital control code 103 prior to the first digital control code 101). Further, the code difference determination circuit 180 comprises a delay circuit 182 configured to delay the third digital control code 103 in order to obtain a delayed third digital control code 103'. The code difference determination circuit 180 additionally comprises a subtractor (combiner) circuit 183 configured to subtract the delayed third digital control code 103' from the first digital control code 101 in order to obtain the binary difference sequence 106. In other words, the code difference determination circuit 180 is configured to determine the respective code difference between the currently input control code for controlling the plurality of DAC cells 150 and the precedingly input control code for controlling the plurality of DAC cells 150.

The binary difference sequence 106 is supplied to the shift code generation circuit 170. The shift code generation circuit 170 comprises a first circuit input (node) 171 configured to receive the binary difference sequence 106. Additionally, the shift code generation circuit 170 comprises second circuit input (node) 172 configured to receive a first pseudorandom binary sequence 186.

A pseudorandom number generator circuit 185 of the DAC 100 is coupled to the second circuit input 172 and configured to generate the first pseudorandom binary sequence 186. For example, the first pseudorandom binary sequence 186 may be a 1-bit sequence.

The shift code generation circuit 170 additionally comprises a code modification circuit 175 configured to modify the binary difference sequence 106 based on the first pseudorandom binary sequence 186 in order to obtain a modified binary difference sequence 106'. As indicated in FIG. 1, the code modification circuit 175 may, e.g., be a multiplier circuit configured to multiply the binary difference sequence 106 with the first pseudorandom binary sequence 186 in order to obtain the modified binary difference sequence 106'. However, it is to be noted that the modification circuit 175 is not limited to a multiplier circuit. In alternative examples, any other circuitry that allows to combine signals may be used instead.

Further, the shift code generation circuit 170 comprises an accumulator circuit 176 configured to add the modified binary difference sequence 106' to a preceding shift code 107 (i.e. a shift code previously generated by the accumulator circuit 176) in order to obtain the shift code 104. In other words, the accumulator circuit 176 accumulates the consecutively generated modified binary difference sequences 106'. A circuit output (node) 177 of the shift code generation circuit 170 is configured to sequentially output the preceding shift code 107 and the shift code 104.

The accumulator circuit 176 comprises an adder circuit 176-1 configured to add the modified binary difference sequence 106' to the preceding shift code 107 in order to obtain the shift code 104. Further, the accumulator circuit 176 comprises a delay element 176-2 coupled between the circuit output 177 and the adder circuit 176-1, wherein the delay element 176-2 is configured to delay and subsequently supply the preceding shift code 107 to the adder circuit 176-1.

Due to the combination of the binary difference sequence 106 and the first pseudorandom binary sequence 186, the shift code 104 allows to shift the second digital control code 102 in a pseudorandom manner to the left and/or to the right. Accordingly, the selection of the activated DAC cells is pseudorandom every time the first digital control code 101 is input to the DAC 100. In other words, the selection of DAC cells is shifted (extended) to the left and/or to the right in a pseudorandom manner every time the first digital control code 101 is input to the DAC 100. Therefore, the correlation between the input first digital control code 101 and the activated (selected) DAC cells may be reduced. Further, since the second digital control code 102 is shifted to the left and/or to the right, the number of state changes (e.g. from active to inactive, or vice versa) of the plurality of DAC cells 150 may be minimized in order to minimize switching noise of the plurality of DAC cells 150.

In order to further reduce the correlation between the activated DAC cells and the input first digital control code 101, an extra random shift may be added.

For applying the extra random shift, the shift code generation circuit 170 further comprises a third circuit input (node) 173 configured to receive a second pseudorandom binary sequence 191. In the example of FIG. 1, a second pseudorandom number generator circuit 190 of the DAC 100 is coupled to the third circuit input 173 and configured to generate the second pseudorandom binary sequence 191. In alternative examples, the pseudorandom number generator circuit 185 may be further coupled to the third circuit input 173 and be configured to generate the second pseudorandom binary sequence 191. For example, if the first digital control code 101 is a N-bit control code, and the second pseudorandom binary sequence 191 may be a N-bit sequence (e.g. N>1).

The shift code generation circuit 170 additionally comprises a fourth circuit input (node) 174 configured to receive a digital value 108 indicating a desired/target value range for the second pseudorandom binary sequence 191.

A range restriction circuit 178 of the shift code generation circuit 170 is configured to receive the digital value 108 and the second pseudorandom binary sequence 191. Further, the range restriction circuit 178 is configured to modify the second pseudorandom binary sequence 191 by restricting a value represented by the second pseudorandom binary sequence 191 to the value range defined by the digital value 108 in order to obtain a modified second pseudorandom binary sequence 191'. The range restriction circuit 178 is configured to output the modified second pseudorandom binary sequence 191'. For example, the range restriction circuit 178 may comprise a bit-shifter circuit (e.g. a barrel shifter), a plurality of AND-Gates implementing a mask function, a multiplication circuit, etc. for restricting the value range of the second pseudorandom binary sequence 191 based on the digital value 108.

The shift code generation circuit 170 additionally comprises a polarity modification circuit 179 configured to modify a polarity of the modified second pseudorandom binary sequence 191' based on the first pseudorandom binary sequence 186 in order to obtain a random shift sequence 109. In other words, the random shift sequence 109 is a value range restricted replica of the second pseudorandom binary sequence 191 with pseudorandom polarity. For example, the polarity modification circuit 179 may comprise a single bit XOR gate configured to: only modify the Most Significant Bit (MSB) of the modified second pseudorandom binary sequence 191' based on the first pseudorandom binary sequence 186, or extend the modified second pseudorandom binary sequence 191' by a sign bit. Alternatively, the polarity modification circuit 179 may comprise a multiplier circuit.

A combiner circuit 195 (e.g. an adder circuit) of the shift code generation circuit 170 is configured to receive the random shift sequence 109, and to modify the shift code 104 by combining (e.g. adding or subtracting) the shift code 104 with the random shift sequence 109. In some examples, the polarity modification circuit 179 may comprise a single bit XOR gate configured to control the combiner circuit 195 to either add or subtract the random shift sequence 109 (which is equal to the modified second pseudorandom binary sequence 191' in this example) to/from the shift code 104.

The additional modification of the shift code 104 by the random shift sequence 109 allows to further randomize the shift of the second digital control code 102 by means of the bit-shifter circuit 130. Therefore, the correlation between the input first digital control code 101 and the activated (selected) DAC cells may be further reduced.

Figure 2:
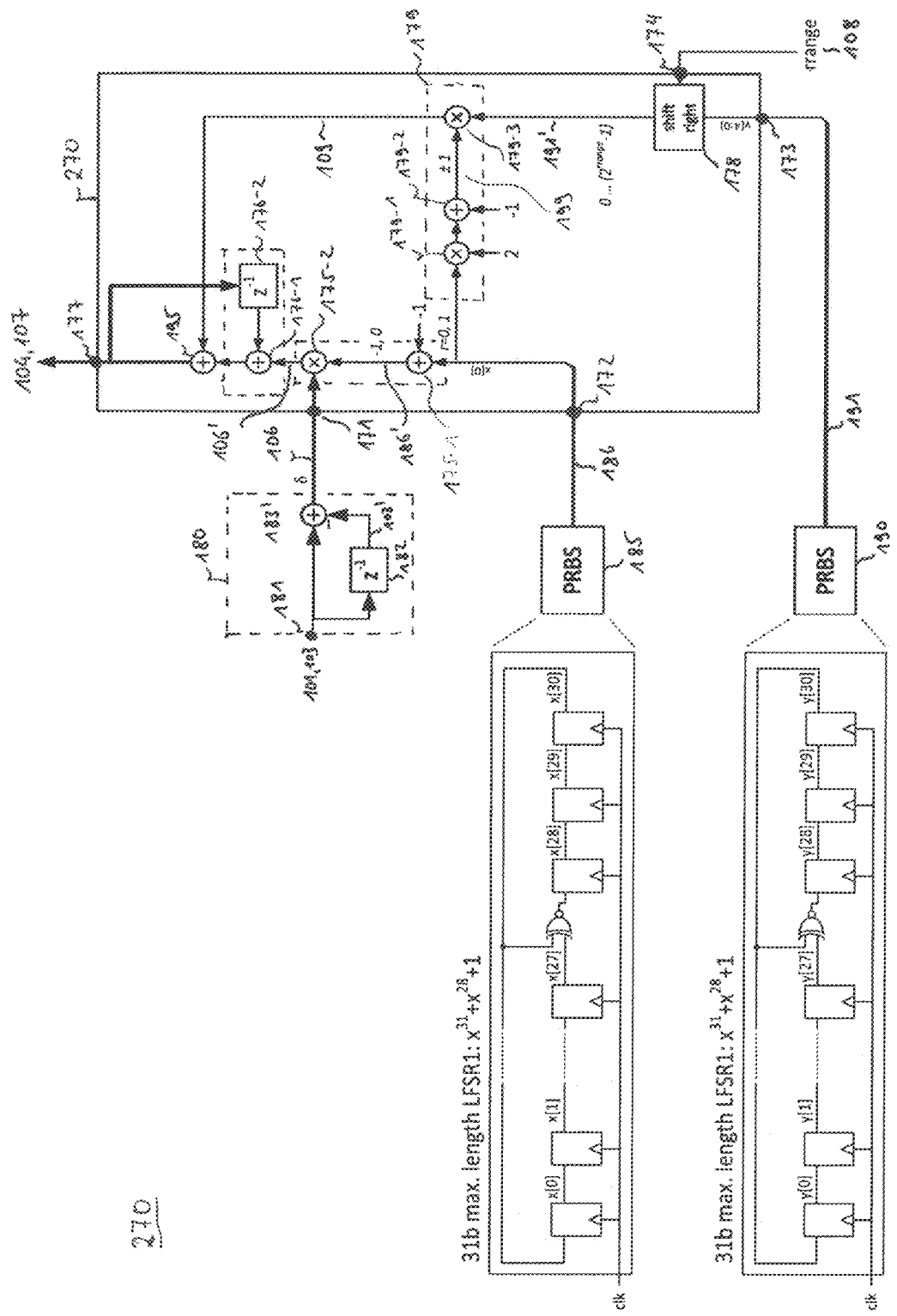
FIG. 2 illustrates an example of a shift code generation circuit.

FIG. 2 illustrates another example of a shift code generation circuit 270. The shift code generation circuit 270 is similar to the shift code generation circuit 170 illustrated in FIG. 1 so that only the differences between both shift code generation circuits will be described in the following.

In the example of FIG. 2, the code modification circuit 175 comprises a first adder circuit 175-1 configured to add a first constant value (e.g. −1) to each bit of the first pseudorandom binary sequence 186 in order to obtain a modified first pseudorandom binary sequence 186'. Further, the code modification circuit 175 comprises a multiplier circuit 175-2 configured to multiply the binary difference sequence 106 and the modified first pseudorandom binary sequence 186' in order to obtain the modified binary difference sequence 106'.

The range restriction circuit 178 is a directional bit-shifter circuit in the example of FIG. 2 that is configured to bit-shift the second pseudorandom binary sequence 191 in a predetermined shift direction (e.g. left or right) based on the digital value 108 in order to obtain a modified second pseudorandom binary sequence 191'.

The pseudorandom number generator circuits 185 and 190 are linear-feedback shift registers. In alternative examples, only one linear-feedback shift register may be used to generate the first pseudorandom binary sequence 186 and the second pseudorandom binary sequence 191.

The polarity modification circuit 179 comprises in the example of FIG. 2 a multiplier circuit 179-1 configured to multiply each bit of the first pseudorandom binary sequence 186 with a constant value (e.g. −2) in order to obtain a multiplied first pseudorandom binary sequence 186". Further, the polarity modification circuit 179 comprises an adder circuit 179-2 configured to add another constant value (e.g. −1) to each bit of the multiplied first pseudorandom binary sequence 186" in order to obtain a modification sequence 199. For example, the modification sequence may be pseudorandom sequence of the values 1 and −1. A combiner circuit 179-3 (e.g. a multiplier circuit) of the polarity modification circuit 179 is configured to modify the polarity of the modified second pseudorandom binary sequence 191' based on the modification sequence 199 in order to obtain the random shift sequence 109. For example, the combiner circuit 179-3 may be configured to (e.g. bitwise) multiply the modified second pseudorandom binary sequence 191' with the modification sequence 199 in order to obtain the random shift sequence 109.

Figure 3:
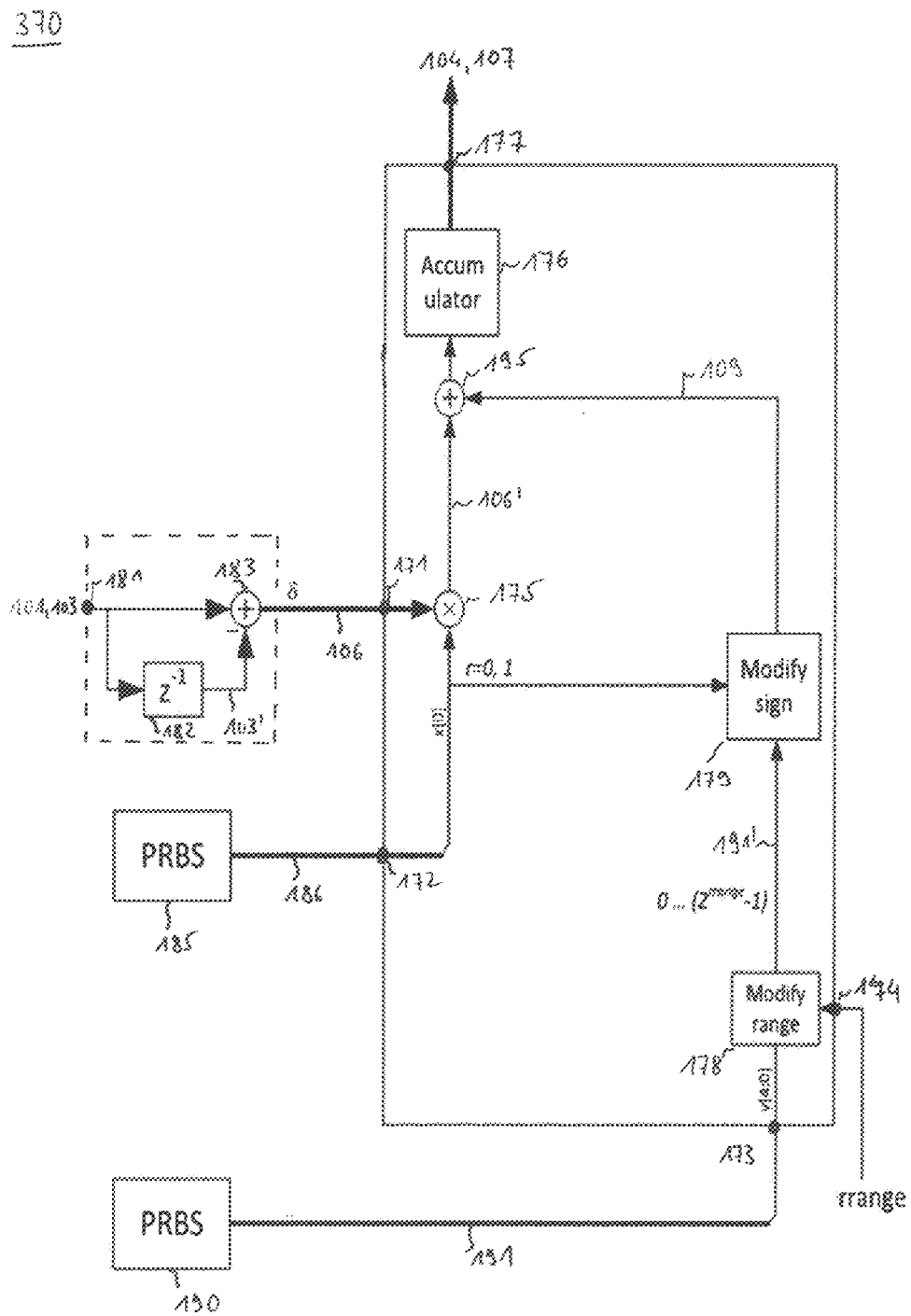
FIG. 3 illustrates another example of a shift code generation circuit.

FIG. 3 illustrates still another example of a shift code generation circuit 370. The shift code generation circuit 370 is similar to the shift code generation circuit 170 illustrated in FIG. 1, only the position of the combiner circuit 195 is different. While the combiner circuit 195 is coupled between the accumulator circuit 176 and the circuit output 177 of the shift code generation circuit 170 in the example of FIG. 1 in order to modify the shift code 104 by combining the shift code 104 and the random shift sequence 109, the combiner circuit 195 is coupled between the code modification circuit 175 and the accumulator circuit 176 in the example of FIG. 3. Accordingly, the adder circuit 195 is configured to modify the modified binary difference sequence 106' by combing the modified binary difference sequence 106' and the random shift sequence 109 in the example of FIG. 3.

Figure 4:
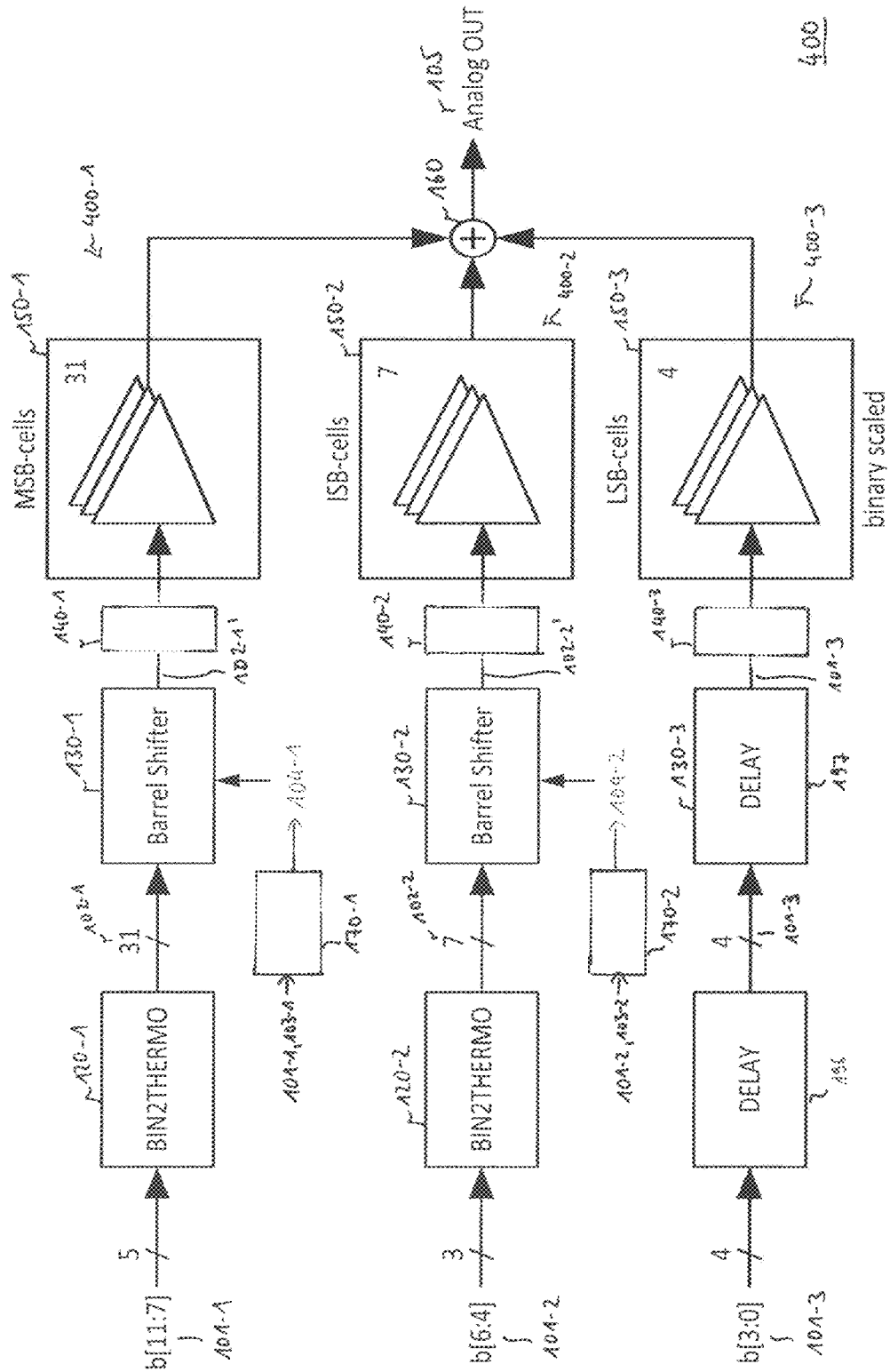
FIG. 4 illustrates a second example of a DAC.

FIG. 4 illustrates an example of a segmented DAC 400. In the example of FIG. 4, the DAC 400 comprises three segments 400-1, 400-2 and 400-3. The segment 400-1 is controlled based on a number of MSBs 101-1 of a first (binary) digital control code. The segment 400-2 is controlled based on a number of Intermediate Significant Bits (ISBs) 101-2 of the first digital control code. The segment 400-3 is controlled based on a number of Least Significant Bits (LSBs) 101-3 of the first digital control code. For example, if the first digital control code is a 12-bit code, the five MSBs may control the segment 400-1, the three ISBs may control the segment 400-2 and the four LSBs may control the segment 400-3.

The plurality of DAC cells 150-3 of the segment 400-3 are binary weighted (scaled), whereas the pluralities of DAC cells 150-1 and 150-2 of the segments 400-1 and 400-2 are unary weighted (scaled).

For controlling the pluralities of DAC cells 150-1 of the segment 400-1, the number of MSBs 101-1 is converted to a second (unary) digital control code 102-1 by a code converter circuit 120-1 of the segment 400-1. Similarly, the number of ISBs 101-2 is converted to a second (unary) digital control code 102-2 by a code converter circuit 120-2 of the segment 400-2.

A respective shift code generation circuit 170-1, 170-2 is configured to generate a respective shift code 104-1, 104-2 for each of the segments 400-1 and 400-2 based on a code difference between the respective first digital control code 101-1, 101-2 and a respective third digital control code 103-1, 103-2 (e.g. a preceding binary control code) in accordance with what is described above. A respective bit-shifter circuit 130-1, 130-2 (e.g. a barrel shifter circuit) is configured to bit-shift the respective second digital control code 102-1, 102-2 based on the respective shift code 104-1, 104-2 in order to obtain a modified second digital control code 102-1', 102-2' for each of the segments 400-1 and 400-2.

A respective cell activation circuit 140-1, 140-2 is configured to selectively activate one or more of the respective plurality of DAC cells 150-1, 150-2 based on the respective modified second digital control code 102-1', 102-2'.

Since the plurality of DAC cells 150-3 of the segment 400-3 are binary weighted, no code conversion is required for the segment. Accordingly, the number of LSBs 101-3 is delayed in order to compensate for the processing times of the code converter circuits and the bit-shifter circuits of the segments 400-1 and 400-2. This is indicated in FIG. 4 by means of the delay elements 196 and 197. However, it is to be noted that in alternative examples a single (i.e. only one) delay element may be used instead. A cell activation circuit 140-3 of the segment 400-3 is configured to selectively activate one or more of the plurality of DAC cells 150-3 based on the delayed number of LSBs 101-3.

An output 160 of the DAC 400 is configured to output an analog output signal 105 based on the cell output signals of the respective activated DAC cells of the pluralities of DAC cells 150-1, 150-2 and 150-3.

Figure 5:
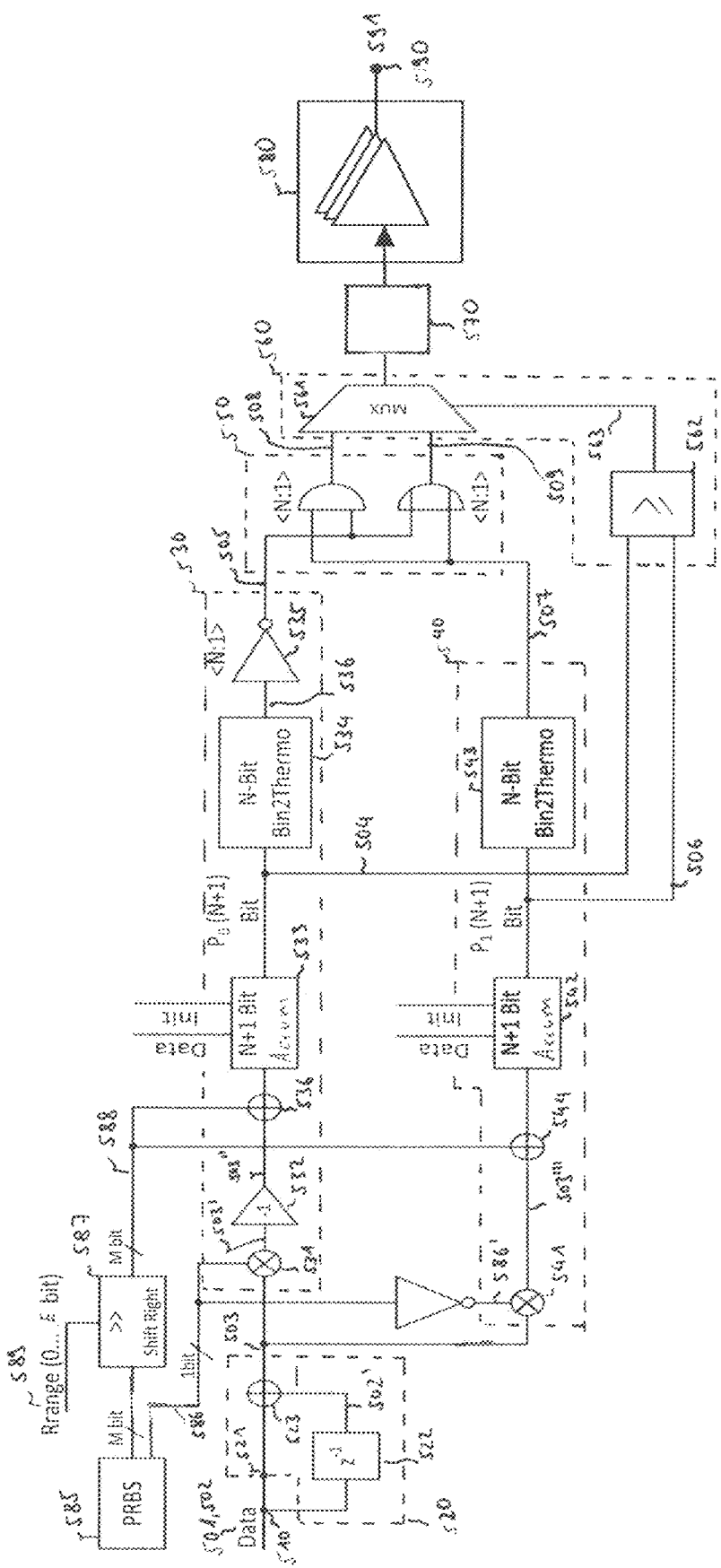
FIG. 5 illustrates a third example of a DAC.

Another example of a DAC 500 is illustrated in FIG. 5. The DAC 500 comprises an input (node) 510 configured to receive a first digital control code 501 for controlling a plurality of DAC cells 580 (i.e. a number of L≥2 DAC cells). Further, the DAC 500 comprises a code difference determination circuit 520 configured to determine, based on the first digital control code 501 and a second digital control code 502, a binary difference sequence 503 indicating a code difference between the first digital control code 501 and the second digital control code 502. The input 510 is configured to receive the second digital control code 502 prior to the first digital control code 501. In other words, the second digital control code 502 and the first digital control code 501 are (timely) succeeding digital control codes for controlling the plurality of DAC cells 180. For example, the first digital control code 501 and the second digital control code 502 may be binary codes.

The code difference determination circuit 520 comprises an input node configured to subsequently receive the first digital control code 501 and the second digital control code 502 (e.g. the second digital control code 502 prior to the first digital control code 501). Further, the code difference determination circuit 520 comprises a delay circuit 522 configured to delay the second digital control code 502. Additionally, the code difference determination circuit 520 comprises a subtractor (combiner) circuit 523 configured to subtract the delayed second digital control code 502' from the first digital control code 501 in order to obtain the binary difference sequence 503. In other words, the code difference determination circuit 520 is configured to determine the respective code difference between the currently input control code for controlling the plurality of DAC cells 580 and the precedingly input control code for controlling the plurality of DAC cells 580.

The binary difference sequence 503 is supplied to each of a first processing line (circuit) 530 and a second processing line (circuit) 540. The first processing line 530 is configured to generate a first digital code 504 based on the binary difference sequence 503, and to generate a second digital code 505 based on the first digital code 504. The second processing line 540 configured to generate a third digital code 506 based on the binary difference sequence 503, and to generate a fourth digital code 507 based on the third digital code 506. For example, the first digital code 504 and the third digital code 506 may be binary codes. The second digital code 505 and the fourth digital code 507 may be unary codes.

A logic circuit 550 of the DAC 500 is configured to combine the second digital code 505 and the fourth digital code 507 using two different logic combinations in order to obtain a third digital control code 508 and a fourth digital control code 509. The third digital control code 508 and the fourth digital control code 509 may be unary codes.

The DAC 500 additionally comprises an output circuit 560 configured to selectively output one of the third and the fourth digital control code 508, 509 based on a comparison of the first digital code 504 and the third digital code 506.

A cell activation circuit 570 of the DAC 500 is configured to selectively activate one or more of the plurality of DAC cells 580 based on the one of the third and the fourth digital control code 508, 509 output by the output circuit 570. Each activated DAC cell is configured to output a respective cell output signal. For example, based on the one of the third and the fourth digital control code 508, 509 output by the output circuit 570, the cell activation circuit 570 may be configured to generate and supply one or more respective activation/drive signals to the plurality of DAC cells 580 for activating and/or driving one or more of the plurality of DAC cells 580. An output (node) 590 of the DAC 500 is configured to output an analog output signal 591 based on the cell output signals of the activated DAC cells.

Controlling the plurality of DAC cells 580 based on one of the third and the fourth digital control code 508, 509 may allow to reduce the correlation between the input first digital control code 501 and the activated (selected) DAC cells. Accordingly, harmonic distortions and noise may be reduced in the analog output signal 591 of the DAC 500.

The first processing line 530 comprises a first combiner circuit 531 configured to combine the binary difference sequence 503 with a first pseudorandom binary sequence 586 in order to obtain a first modified binary difference sequence 503'. For example, the first pseudorandom binary sequence 586 may be a 1-bit sequence. A multiplier circuit 532 (e.g. comprising a plurality of AND gates) of the first processing line 530 is configured to multiply the first modified binary difference sequence 503' with a constant value (e.g. −1) in order to obtain a second modified binary difference sequence 503".

The first processing line 530 further comprises a first accumulator circuit 533 configured to generate the first digital code 504 based on the second modified binary difference sequence 503". The first accumulator circuit 533 is configured to generate the first digital code 504 by adding the second modified binary difference sequence 503" to a sixth digital code (i.e. a digital code previously generated and output by the first accumulator circuit 533). In other words, the first accumulator circuit 533 accumulates the consecutively generated modified binary difference sequences 503".

A first code converter circuit 534 of the first processing line 530 is configured convert the first digital code 504 to a fifth digital code 536 (e.g. a unary code). An inverter circuit 535 of the first processing line 530 is configured to invert the fifth digital code 535 in order to obtain the second digital code 505.

The second processing line 540 comprises a second combiner circuit 541 configured to combine the binary difference sequence 503 with an inverse 586' of the first pseudorandom binary sequence 586 in order to obtain a third modified binary difference sequence 503'''.

A pseudorandom number generator circuit 585 of the DAC 500 is configured to generate the first pseudorandom binary sequence 586. For example, the pseudorandom number generator circuit 585 may be a linear-feedback shift register. An inverter circuit 587 is coupled between the pseudorandom number generator circuit 585 and the second combiner circuit 540. The inverter circuit 587 is configured to invert the first pseudorandom binary sequence 586, and to supply the inverse 586' of the first pseudorandom binary sequence to the second combiner circuit 541.

A second accumulator circuit 542 of the second processing line 540 is configured to generate the third digital code 506 based on the third modified binary difference sequence 503'''. The second accumulator circuit 542 is configured to generate the third digital code 506 by adding the third modified binary difference sequence 503''' to a seventh digital code (i.e. a digital code previously generated and output by the second accumulator circuit 542). In other words, the second accumulator circuit 542 accumulates the consecutively generated modified binary difference sequences 503'''. A second code converter circuit 543 is configured convert the third digital code 506 to the fourth digital code 507.

The logic circuit 550 comprises an AND gate 551 configured to generate the third digital control code 508 based on the second digital code 505 and the fourth digital code 507. In particular, the AND gate 551 is configured to perform a logic AND conjunction of the second digital code 505 and the fourth digital code 507. Further, the logic circuit 550 comprises an OR gate 552 configured to generate the fourth digital control code 509 based on the second digital code 505 and the fourth digital code 507. In particular, the OR gate 552 is configured to perform a logic OR conjunction of the second digital code 505 and the fourth digital code 507.

The output circuit 560 comprises a multiplexer 561 configured to selectively output one of the third digital control code 508 and the fourth digital control code 509 based on a control signal 563. A comparison circuit 562 of the output circuit 560 is configured to generate the control signal 563 based on the comparison of the first digital code 508 and the third digital code 509.

The combination of the binary difference sequence 503 with the first pseudorandom binary sequence 586 or the inverse 586' thereof in each of the first and second processing line 530, 540 allows to shift each of the second digital code 505 and the fourth digital code 507 in a pseudorandom manner to the left and/or to the right. Therefore, also the third and the fourth digital control code 508, 509 may be shifted in a pseudorandom manner. Accordingly, the selection of the activated DAC cells is pseudorandom every time the first digital control code 501 is input to the DAC 500. In other words, the selection of DAC cells is shifted (extended) to the left and/or to the right in a pseudorandom manner every time the first digital control code 501 is input to the DAC 500. Therefore, the correlation between the input first digital control code 501 and the activated (selected) DAC cells may be reduced. Further, since the third and the fourth digital control code 508, 509 are shifted to the left and/or to the right, the number of state changes (e.g. from active to inactive, or vice versa) of the plurality of DAC cells 580 may be minimized in order to minimize switching noise of the plurality of DAC cells 580.

An exemplary shift behavior of the DAC 500 is illustrated in FIG. 6 for three consecutive binary digital control words input to the DAC 500. In the example of FIG. 6, it is assumed that the digital control word input to the DAC 500 is $x(n)=3$ in an initial state n, $x(n+1)=5$ in a succeeding state n+1, and $x(n+2)=11$ in a succeeding state n+2.

Further, it is assumed that in the initial state n the first digital code 504 (which may be understood as a first pointer) is $p_0(n)=7$, and that the third digital code 506 (which may be understood as a second pointer) is $p_1(n)=10$. A corresponding register $R_0(n)$ representing the unary second digital code 505 as well as a corresponding register $R_1(n)$ representing the unary fourth digital code 507 is illustrated in FIG. 6. Since $p_0(n)=7$, the first seven positions of the register $R_0(n)$ for the second digital code 505 are zeros. Similarly, since $p_1(n)=10$, the first ten positions of the register $R_1(n)$ for the fourth digital code 507 are ones.

In the initial state n, $p_1(n) > p_0(n)$ so that the comparison circuit 562 generates the control signal 563 such that the multiplexer 561 outputs the third digital control code 508, i.e. the logic AND conjunction of the second digital code 505 the fourth digital code 507. It can be seen from an output register T (n)=$R_0(n)$ AND $R_1(n)$ representing the third digital control code 508 in the initial state n that the three positions of the output register T (n) at which both registers $R_0(n)$ and $R_1(n)$ show ones also show ones. Therefore, three DAC cells of the plurality of DAC cells 580 will be activated by the cell activation circuit 570.

In the succeeding state n+1, $x(n+1)=5$ such that the code difference $d(n+1)=x(n+1)-x(n)$ as represented by the binary difference sequence 586 represents $d(n+1)=2$. It is assumed that the (1-bit) first pseudorandom binary sequence exhibits a zero for the state n+1 such that only the third digital code 506 is updated since the first modified binary difference sequence 503' is zero. Therefore, $p_1(n+1)=p_1(n)+d(n+1)=10+2=12$ and $p_0(n+1)=p_0(n)=7$.

Accordingly, the register $R_0(n+1)$ for the second digital code 505 is equal to $R_0(n)$. The corresponding register $R_1(n+1)$ for the fourth digital code 507 comprises two additional ones.

Also in the succeeding state n+1, $p_1(n+1) > p_0(n+1)$ such that the comparison circuit 562 generates the control signal 563 such that the multiplexer 561 outputs the updated third digital control code 508. Therefore, the output register T (n+1) shows ones at five positions such that five DAC cells of the plurality of DAC cells 580 will be activated by the cell activation circuit 570.

In the succeeding state n+2, $x(n+2)=11$ such that the code difference $d(n+2)=x(n+2)-x(n+1)$ as represented by the binary difference sequence 503 represents d $(n+2)=6$. It is assumed that the (1-bit) first pseudorandom binary sequence 586 exhibits a zero for the state n+2 such that only the third digital code 506 is updated since the first modified binary difference sequence 503' is again zero. Therefore, $p_1(n+2)=p_1(n+1)+d (n+2)=12+6=18$. However, since the value range of the third digital code 506 is limited to 4 bit (i.e. 0, ..., 15), overflow occurs such that $p_1(n+2)=1-15=3$. The corresponding register $R_1(n+2)$ for the fourth digital code 507 is filled with ones at the right end until the last position is filled. Further, three ones are added to the beginning of $R_1(n+2)$ due to the overflow.

Since $p_0(n+2)=p_0(n+1)=7$, the register $R_0(n+2)$ for the fourth digital code 507 is equal to $R_0(n+1)$.

In the state n+2, $p_0(n+2) > p_1(n+2)$ such that the comparison circuit 562 generates the control signal 563 such that the multiplexer 561 outputs the updated fourth digital control code 509. Therefore, the output register T(n+2) shows ones at positions at which any of the registers $R_0(n)$ and $R_1(n)$ shows ones. Accordingly, the output register T(n+2) shows ones at eleven positions such that eleven DAC cells of the plurality of DAC cells 580 will be activated by the cell activation circuit 570.

Similar to what is described in the above example of FIG. 6, the first digital code 504, i.e. $p_0(n)$, may be updated if the (1-bit) first pseudorandom binary sequence 586 exhibits a one for a state. As is evident from the above example of FIG. 6, the accumulation operation in each of the first accumulation circuit 533 and the second accumulation circuit 542 is as follows:

$$p_{0/1}(n+1)=[p_{0/1}(n)+d(n+1)] \bmod Z$$

Z denotes the bit-length of the first digital word 504 and the third digital word 506. In other words, the accumulation operation in the first accumulation circuit 533 as well as the second accumulation circuit 542 allows integer overflow (arithmetic overflow).

The circuitry illustrated in FIG. 5 may be understood as an hardware implementation for the output register T(n) of length Z (the maximum bit value) that contains the DAC cell selection for each input sample n of the digital control code, the two auxiliary registers $R_0(n)$ and $R_1(n)$ and the two pointers $p_0(n)$ and $p_1(n)$ that control the content of the auxiliary registers $R_0(n)$ and $R_1(n)$. As in the above example, the content of the auxiliary register $R_1(n)$ is equal to one for the positions up to $p_1(n)$. On the other hand, the content of the auxiliary register $R_0(n)$ is equal to zero for the positions up to $p_0(n)$.

Each time a new input x(n+1) needs to be encoded, the first pseudorandom binary sequence 586 allows to randomly decide whether the new input is encoded through right or left pointer shift. Subsequently, the pointers are updated. The update of the pointers and registers may be summarized as follows:
1) Calculate the difference to the previous bit (input digital control word): d(n+1)=x(n+1)−x(n)
2) For a right pointer shift (first pseudorandom binary sequence 586 shows zero):
   a. If d(n+1)>0, update $p_1(n+1)=p_1(n)+d(n+1)$. This operation allows overflow if $p_1(n+1)>Z$.
   b. If d(n+1)<0, update $p_1(n+1)=p_1(n)+d(n+1)$. This is equivalent to updating $p_0(n+1)=p_0(n)−d(n+1)$. Also this operation allows overflow if $p_{0/1}(n+1)>Z$.
3) For a left pointer shift (first pseudorandom binary sequence 586 shows one):
   a. If d(n+1)<0, update $p_0(n+1)=p_0(n)−d(n+1)$. This is equivalent to updating $p_1(n+1)=p_1(n)+d(n+1)$. This operation allows overflow if $p_{0/1}(n+1)<1$.
   b. If d(n+1)>0, update $p_0(n+1)=p_0(n)−d(n+1)$. This operation allows overflow if $p_0(n+1)<1$.
4) Update the output register T(n+1) as follows:
   a. If $p_1(n+1) \geq p_0(n+1)$, $T(n+1)=R_0(n+1)$ AND $R_1(n+1)$ (bitwise operation)
   b. If $p_1(n+1) < p_0(n+1)$, $T(n+1)=R_0(n+1)$ OR $R_1(n+1)$ (bitwise operation)

In other examples, if $p_1(n+1)=p_0(n+1)$, the output register may alternatively be selected to be either $T(n+1)=R_0(n+1)$ AND $R_1(n+1)$ or $T(n+1)=R_0(n+1)$ OR $R_1(n+1)$ depending on the previous one or more overflows of one or both of the pointers $p_0(n)$ and $p_1(n)$.

The proposed encoding selects the leftmost or rightmost DAC cells from those already selected and extends the selection to DAC cells at the left or right if needed. Left of right selection is randomly chosen for each sample. The implementation is simple. For example, as shown in FIG. 5, two auxiliary registers and pointers combined with bitwise "AND" and "OR" operation may be used. The proposed encoding may allow for the design of DAC encoders that minimize both harmonic distortion and noise simultaneously with a very simple, hardware friendly method. Therefore, the performance of high-performance DACs may be improved at a small cost in terms of gates, die area and power consumption.

Returning back to FIG. 5, an extra random shift may be added in order to further reduce the correlation between the activated DAC cells and the input first digital control code 501.

For adding the extra random shift, the first processing line 530 further comprises a first adder circuit 536 coupled between the multiplier circuit 532 and the first accumulator circuit 533. The first adder circuit 536 is configured to modify the second modified binary difference sequence 503" by adding a second pseudorandom binary sequence 588. Similarly, the second processing line 540 further comprises a second adder circuit 544 coupled between the second combiner circuit 541 and the second accumulator circuit 542. The second adder circuit 544 is configured to modify the third modified binary difference sequence 503'" by adding the second pseudorandom binary sequence 588. For example, the second pseudorandom binary sequence 588 may be a M-bit sequence (M≥1).

In the example of FIG. 5, the pseudorandom number generator circuit 585 is further configured to generate the second pseudorandom binary sequence 588. In alternative examples, a separate (second) pseudorandom number generator circuit may be provided for generating the second pseudorandom binary sequence 588. A range restriction circuit 587 is coupled between the pseudorandom number generator circuit 585 and each of the first processing line 530 and the second processing line 540. The range restriction circuit 587 is configured to receive the second pseudorandom binary sequence 588 and a digital value 589 indicating a desired/target value range for the second pseudorandom binary sequence 588. The range restriction circuit 587 is further configured to modify the second pseudorandom binary sequence 588 by restricting a value represented by the second pseudorandom binary sequence 588 to a value range defined by the digital value 589. For example, the range restriction circuit 587 may comprise a bit-shifter circuit (e.g. a barrel shifter), a plurality of AND-Gates implementing a mask function, a multiplication circuit, etc. for restricting the value range of the second pseudorandom binary sequence 588 based on the digital value 589.

The additional modification of the second modified binary difference sequence 503" and the third modified binary difference sequence 503'" allows to further randomize the shift of the third digital control code 508 and the fourth digital control code 509. Therefore, the correlation between the input first digital control code 501 and the activated (selected) DAC cells may be further reduced.

Figure 7:
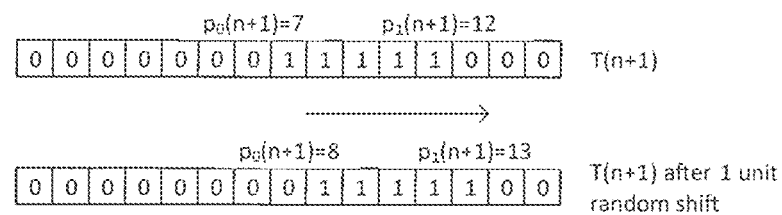
FIG. 7 illustrates an exemplary random shift of a digital code.

FIG. 7 exemplarily illustrates how the additional random shift changes third digital control code 508 and the fourth digital control code 509. FIG. 7 illustrates in the upper part the output register T(n+1) for the state n+1 as described above in connection with FIG. 6. In the lower part of FIG. 7, the additional random shift is applied. In the example of FIG. 7 it is assumed that the second pseudorandom binary sequence 588 represents one (could be any other randomly selected value as well) for the state n+1 such that each of the pointers $p_0(n+1)$ and $p_1(n+1)$ is incremented by one. Accordingly, the positions in the auxiliary registers $R_0(n)$ and $R_1(n)$ which are filled with ones are shifted to the right by one position. As a consequence, the positions in the output register T(n+1) which are filled with ones are shifted to the right by one position such that the random shift causes the activation of different DAC cells.

Returning back to FIG. 5, an exemplary implementation of the comparison circuit 562 will be described in the following. For example, if the third digital control code 508 and the fourth digital control code 509 are N-bit (unary) codes and if the first digital code 504 and the third digital code 506 are (binary) N+1-bit codes, the comparison circuit 562 may be configured to exclusively compare the MSB of the first digital code 504 to the MSB of the third digital code 506 in order to generate the control signal 563. The comparison circuit 562 may, e.g., comprises an XOR gate for comparing the MSB of the first digital code 504 to the MSB of the third digital code 506 (i.e. the XOR gate is configured to perform a logic OR conjunction of the MSB of the first digital code 504 and the MSB of the third digital code 506).

If the MSB of the first digital code 504 and the MSB of the third digital code 506 exhibit different bit values (e.g. 0 and 1), the comparison circuit 563 may be configured to generate the control signal 563 such that the multiplexer 561 outputs the third digital control code 508 (i.e. the logic AND conjunction the second digital code 505 and the fourth digital code 507). On the other hand, if the MSB of the first digital code 504 and the MSB of the third digital code 506 exhibit the same bit value, the comparison circuit 563 may be configured to generate the control signal 563 such that the multiplexer 561 outputs the fourth digital control code 509 (i.e. the logic OR conjunction the second digital code 505 and the fourth digital code 507).

Figure 8:
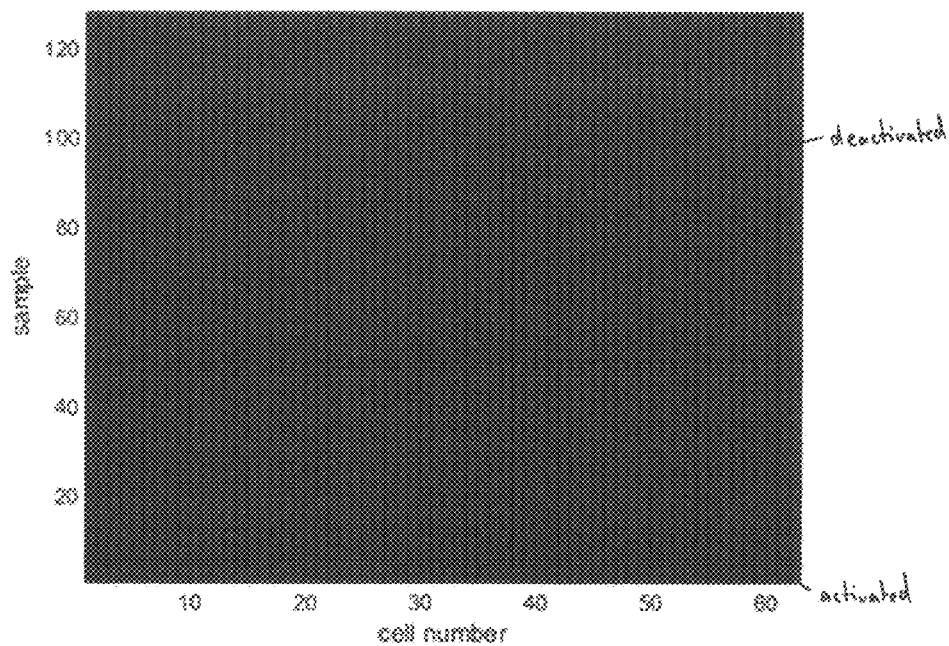
FIG. 8 illustrates a first example of activated DAC cells.

FIG. 8 illustrates an example of activated DAC cells in a DAC comprising 63 DAC cells and using one of the proposed encoding schemes. The same sequence of digital control codes is repetitively input (i.e. each input code repeats every k samples). The activated DAC cells and the deactivated DAC cells are illustrated in FIG. 8 using differently hatched patterns. As can be seen from FIG. 8, although the same sequence of digital control codes is repetitively input to the DAC, the activated DAC cells are not the same for each repetition of the digital control codes.

Figure 9:
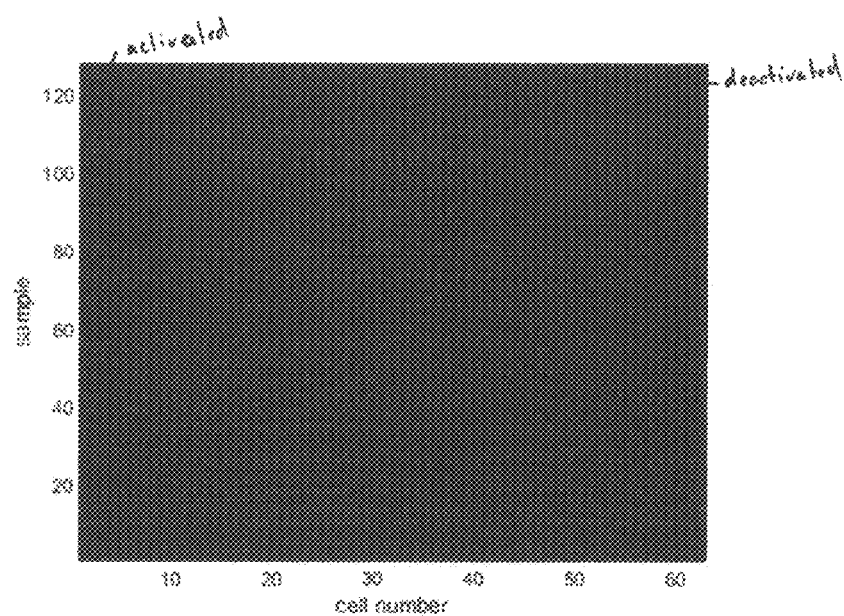
FIG. 9 illustrates a second example of activated DAC cells.

As a reference, FIG. 9 illustrates an example of activated DAC cells in a DAC comprising 63 DAC cells using conventional thermometer encoding. As can be seen from FIG. 9, substantially the same DAC cells are activated for each repetition of the digital control codes.

Figure 10:
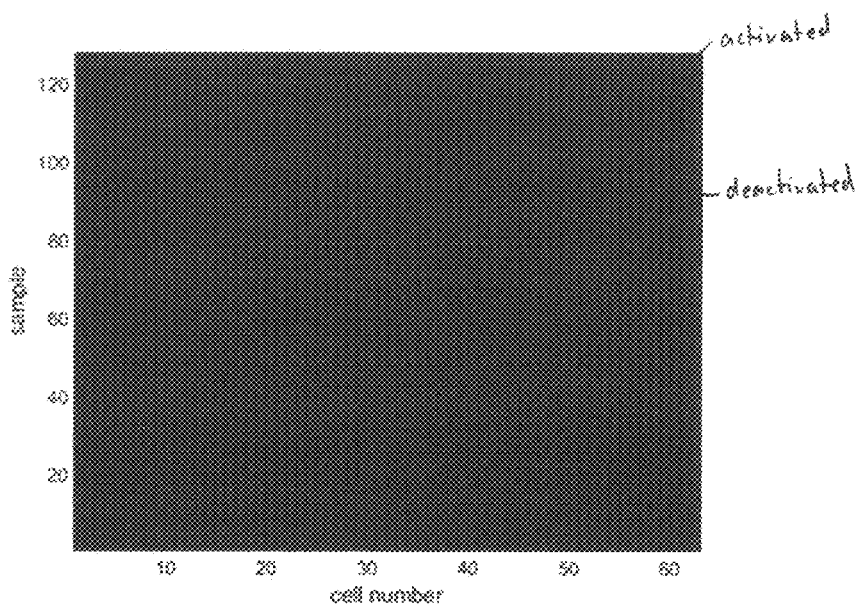
FIG. 10 illustrates a third example of activated DAC cells.

Further, FIG. 10 illustrates an example of activated DAC cells in a DAC comprising 63 DAC cells using mismatch scrambling for encoding. As can be seen from FIG. 9, although the same sequence of digital control codes is repetitively input to the DAC, the activated DAC cells are not the same for each repetition of the digital control codes. However, compared to FIG. 8, much more switching occurs in the example of FIG. 10 such that increased switching noise in the DAC output signal may be observed.

The proposed DAC cell selection may provide a good trade-off between the following aspects:
  a) select a different set of DAC cells each time a specific digital control code is input in order to reduce harmonic distortions;
  b) minimize changes in the state of each DAC cell between succeeding digital control codes input to the DAC (e.g. from active in to inactive, and vice versa) in order to minimize switching noise; and
  c) be simple to implement since the DAC cell selection should run at high DAC sampling rates.

The proposed DAC cell selection may enable improved Dynamic Element Matching (DEM) with an optional random add-on.

Figure 11:
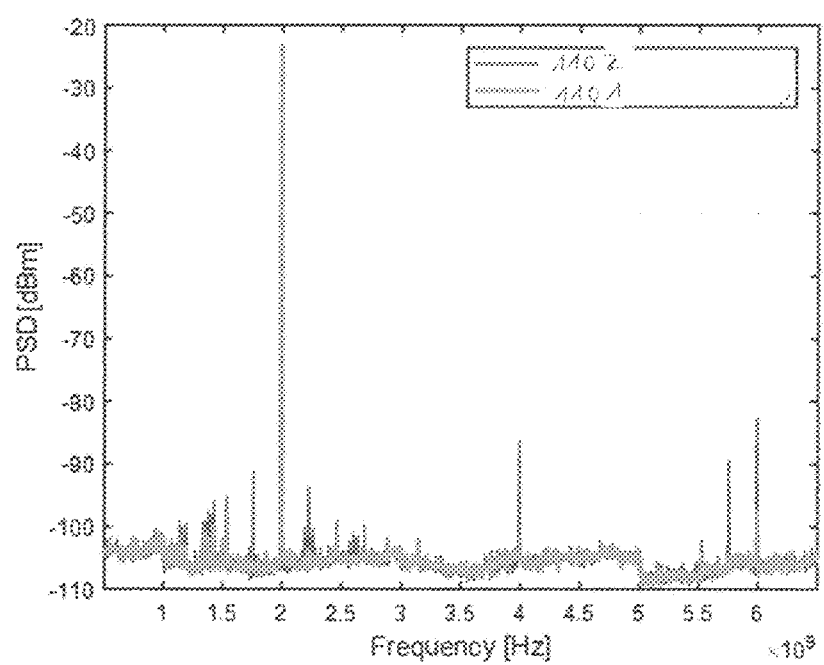
FIG. 11 illustrates exemplary Power-Spectral-Densities (PSD) of DAC output signals.

FIG. 11 illustrates the PSD 1101 of an analog output signal (with a frequency of 2 GHz) of a DAC according to one or more aspects of the architecture described above in connection with FIGS. 1 to 7 or one or more examples described above in connection with FIGS. 1 to 7. As a reference, the PSD 1102 of an analog output signal of a conventional DAC is illustrated. As can be seen from FIG. 11, harmonic distortions are heavily suppressed in the PSD 1101 compared to the PSD 1102. Hence, the proposed DAC may enable improved generation of analog signals.

Figure 12:
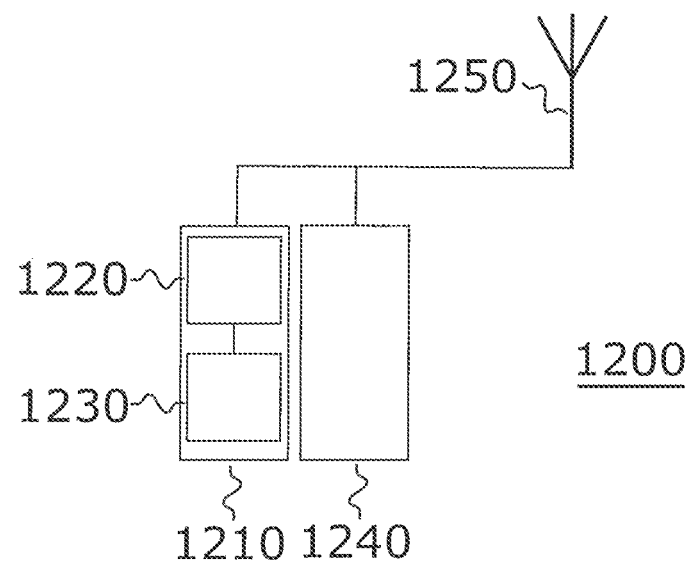
FIG. 12 illustrates an example of a base station.

An example of an implementation using a DAC according to one or more aspects of the architecture described above in connection with FIGS. 1 to 7 or one or more examples described above in connection with FIGS. 1 to 7 is illustrated in FIG. 12. FIG. 12 schematically illustrates an example of a radio base station 1200 (e.g. for a femtocell, a picocell, a microcell or a macrocell) comprising a DAC 1220 as proposed.

The DAC 1220 is part of a transmitter 1210. The transmitter 1210 additionally comprises a digital circuit 1230 configured to supply the first digital control code to the input of the DAC 1220. For example, the digital circuit 1230 may be configured to generate the digital input word based on data to be wirelessly transmitted.

The base station 1200 comprises at least one antenna element 1250 coupled to the transmitter 1210 for radiating one or more Radio Frequency (RF) transmit signals that are based on the analog output signal of the DAC 1220 to the environment. For example, the DAC 1220 may be coupled to the antenna element 1250 via one or more intermediate elements such as a filter, an up-converter (mixer) or a Power Amplifier (PA).

Additionally, the base station 1200 comprises a receiver 1240 configured to receive a RF receive signal from the antenna element 1250 or another antenna element (not illustrated) of the base station 1200.

To this end, a base station comprising a high-speed DAC with improved performance for RF transmit signal generation may be provided.

The base station 1200 may comprise further elements such as, e.g., a baseband processor, an application processor, memory, a network controller, a user interface, power management circuitry, a satellite navigation receiver, a network interface controller or power tee circuitry.

In some aspects, the application processor may include one or more Central Processing Unit CPU cores and one or more of cache memory, a Low-DropOut (LDO) voltage regulator, interrupt controllers, serial interfaces such as Serial Peripheral Interface (SPI), Inter-Integrated Circuit (I²C) or universal programmable serial interface module, Real Time Clock (RTC), timer-counters including interval and watchdog timers, general purpose Input-Output (10), memory card controllers such as Secure Digital (SD)/MultiMedia Card (MMC) or similar, Universal Serial Bus (USB) interfaces, Mobile Industry Processor Interface Alliance (MIPI) interfaces and Joint Test Access Group (JTAG) test access ports.

In some aspects, the baseband processor may be implemented, for example, as a solder-down substrate including one or more integrated circuits, a single packaged integrated circuit soldered to a main circuit board or a multi-chip module containing two or more integrated circuits.

In some aspects, the memory may include one or more of volatile memory including Dynamic Random Access Memory (DRAM) and/or Synchronous Dynamic Random Access Memory (SDRAM), and Non-Volatile Memory (NVM) including high-speed electrically erasable memory (commonly referred to as Flash memory), Phase change Random Access Memory (PRAM), Magnetoresistive Random Access Memory (MRAM) and/or a three-dimensional crosspoint (3D XPoint) memory. The memory may be implemented as one or more of solder down packaged integrated circuits, socketed memory modules and plug-in memory cards.

In some aspects, the power management integrated circuitry may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, the power tee circuitry may provide for electrical power drawn from a network cable to provide both power supply and data connectivity to the base station using a single cable.

In some aspects, the network controller may provide connectivity to a network using a standard network interface protocol such as Ethernet. Network connectivity may be provided using a physical connection which is one of electrical (commonly referred to as copper interconnect), optical or wireless.

In some aspects, the satellite navigation receiver module may include circuitry to receive and decode signals transmitted by one or more navigation satellite constellations such as the Global Positioning System (GPS), GLObalnaya NAvigatSionnaya Sputnikovaya Sistema (GLONASS), Galileo and/or BeiDou. The receiver may provide data to the application processor which may include one or more of position data or time data. The application processor may use time data to synchronize operations with other radio base stations.

In some aspects, the user interface may include one or more of physical or virtual buttons, such as a reset button, one or more indicators such as Light Emitting Diodes (LEDs) and a display screen.

Figure 13:
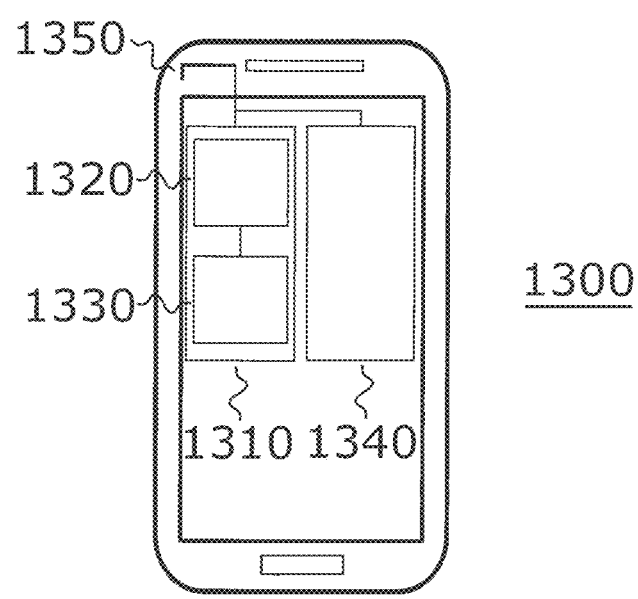
FIG. 13 illustrates an example of a mobile device.
Figure 14:
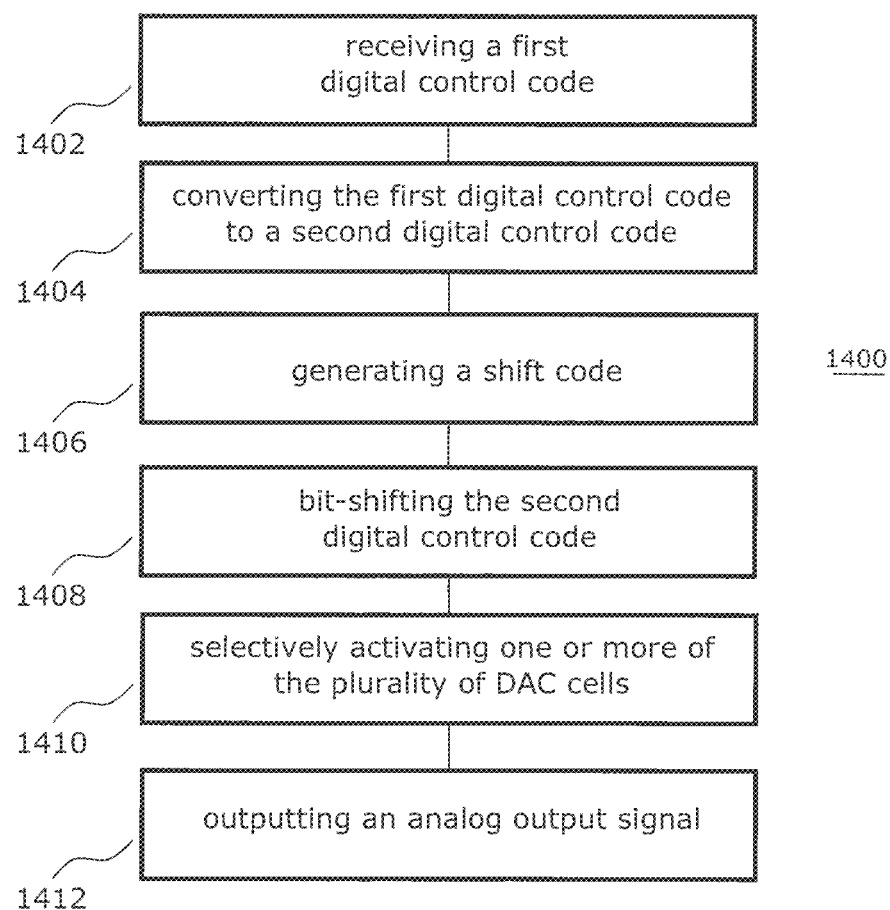
FIG. 14 illustrates a flowchart of an example of a method for a DAC.
Figure 15:
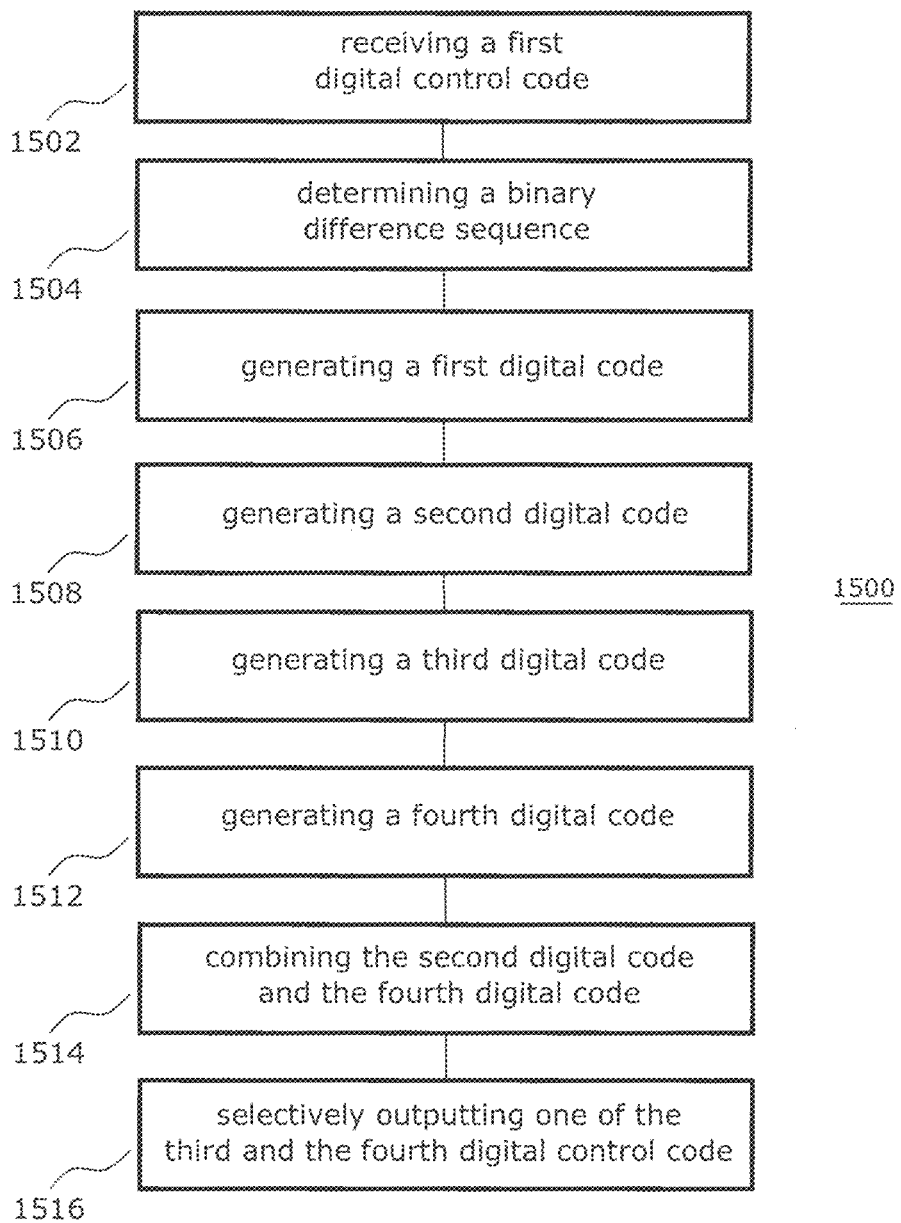
FIG. 15 illustrate a flowchart of another example of a method for a DAC.

Another of an implementation using a DAC according to one or more aspects of the architecture described above in connection with FIGS. 1 to 7 or one or more examples described above in connection with FIGS. 1 to 7 is illustrated in FIG. 13. FIG. 13 schematically illustrates an example of a mobile device 1300 (e.g. mobile phone, smartphone, tablet-computer, or laptop) comprising a DAC 1320 as proposed.

The DAC 1320 is part of a transmitter 1310. The transmitter 1310 additionally comprises a digital circuit 1330 configured to supply the first digital control code to the input of the DAC 1320. For example, the digital circuit 1330 may be configured to generate the digital input word based on data to be wirelessly transmitted.

The mobile device 1300 comprises at least one antenna element 1350 coupled to the transmitter 1310 for radiating one or more RF transmit signals that are based on the analog output signal of the DAC 1320 to the environment. For example, the DAC 1320 may be coupled to the antenna element 1350 via one or more intermediate elements such as a filter, an up-converter (mixer) or a PA.

Additionally, the mobile device 1300 comprises a receiver 1340 configured to receive a RF receive signal from the antenna element 1350 or another antenna element (not illustrated) of the mobile device 1300.

To this end, a mobile device comprising a high-speed DAC with improved performance for RF transmit signal generation may be provided.

The mobile device 1300 may comprise further elements such as, e.g., a baseband processor, memory, a connectivity module, a Near Field Communication (NFC) controller, an audio driver, a camera driver, a touch screen, a display driver, sensors, removable memory, a power management integrated circuit or a smart battery.

In some aspects, the application processor may include, for example, one or more CPU cores and one or more of cache memory, LDO regulators, interrupt controllers, serial interfaces such as SPI, I²C or universal programmable serial interface module, RTC, timer-counters including interval and watchdog timers, general purpose input-output (IO), memory card controllers such as SD/MMC or similar, USB interfaces, MIPI interfaces and JTAG test access ports.

In some aspects, the baseband module may be implemented, for example, as a solder-down substrate including one or more integrated circuits, a single packaged integrated circuit soldered to a main circuit board, and/or a multi-chip module containing two or more integrated circuits.

The wireless communication circuits using ADC segment mismatch correction according to the proposed architectures or one or more of the examples described above may be configured to operate according to one of the 3GPP-standardized mobile communication networks or systems. The mobile or wireless communication system may correspond to, for example, a 5G NR, a Long-Term Evolution (LTE), an LTE-Advanced (LTE-A), High Speed Packet Access (HSPA), a Universal Mobile Telecommunication System (UMTS) or a UMTS Terrestrial Radio Access Network (UTRAN), an evolved-UTRAN (e-UTRAN), a Global System for Mobile communication (GSM), an Enhanced Data rates for GSM Evolution (EDGE) network, or a GSM/EDGE Radio Access Network (GERAN). Alternatively, the wireless communication circuits may be configured to operate according to mobile communication networks with different standards, for example, a Worldwide Inter-operability for Microwave Access (WI-MAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

For further illustrating the DAC described above in connection with FIGS. 1 to 4, FIG. 14 illustrates a flowchart of a method 1400 for a DAC. The method 1400 comprises receiving 1402 a first digital control code for controlling a plurality of DAC cells. Additionally, the method 1400 comprises converting 1404 the first digital control code to a second digital control code. The method 1400 comprises generating 1406 a shift code based on a code difference between the first digital control code and a third digital control code. Further, the method 1400 comprises bit-shifting 1408 the second digital control code based on the shift code in order to obtain a modified second digital control code. The method 1400 comprises selectively activating 1410 one or more of the plurality of DAC cells based on the modified second digital control code, wherein each activated DAC cell outputs a respective cell output signal. The method 1400 comprises outputting 1412 an analog output signal based on the cell output signals.

The method 1400 may allow to reduce the correlation between the input first digital control code and the activated DAC cells.

More details and aspects of the method 1400 are explained in connection with the proposed technique or one or more examples described above (e.g. FIGS. 1 to 4). The method 1400 may comprise one or more additional optional features corresponding to one or more aspects of the proposed technique or one or more examples described above.

For further illustrating the DAC described above in connection with FIGS. 5 to 7, FIG. 15 illustrates a flowchart of another method 1500 for a DAC. The method 1500 comprises receiving 1502 a first digital control code for controlling a plurality of DAC cells. The method 1500 further comprises determining 1504, based on the first digital control code and a second digital control code, a binary difference sequence indicating a code difference between the first digital control code and the second digital control code. Additionally, the method 1500 comprises generating 1506 a first digital code based on the binary difference sequence using a first processing line. The method 1500 comprises generating 1508 a second digital code based on the first digital code using the first processing line. Further, the method 1500 comprises generating 1510 a third digital code based on the binary difference sequence using a second processing line. The method 1500 comprises generating 1512 a fourth digital code based on the third digital code using the second processing line. Additionally, the method 1500 comprises combining 1514 the second digital code and the fourth digital code using two different logic combinations in order to obtain a third and a fourth digital control code. Further, the method 1500 comprises selectively outputting 1516 one of the third and the fourth digital control code based on a comparison of the first digital code and the third digital code.

The method 1500 may allow to reduce the correlation between the input first digital control code and the activated DAC cells.

More details and aspects of the method 1500 are explained in connection with the proposed technique or one or more examples described above (e.g. FIGS. 5 to 7). The method 1500 may comprise one or more additional optional features corresponding to one or more aspects of the proposed technique or one or more examples described above.

The examples described herein may be summarized as follows:

Example 1 is a DAC, comprising: an input configured to receive a first digital control code for controlling a plurality of DAC cells; a code converter circuit configured to convert the first digital control code to a second digital control code; a shift code generation circuit configured to generate a shift code based on a code difference between the first digital control code and a third digital control code; a bit-shifter circuit configured to bit-shift the second digital control code based on the shift code in order to obtain a modified second digital control code; a cell activation circuit configured to selectively activate one or more of the plurality of DAC cells based on the modified second digital control code, wherein each activated DAC cell is configured to output a respective cell output signal; and an output configured to output an analog output signal based on the cell output signals.

Example 2 is the DAC of example 1, wherein the input is configured to receive the third digital control code prior to the first digital control code.

Example 3 is the DAC of example 1 or example 2, wherein the first digital control code and the third digital control code are binary codes, and wherein the second digital control code is a unary code.

Example 4 is the DAC of any of examples 1 to 3, wherein the shift code generation circuit comprises: a first circuit input configured to receive a binary difference sequence indicating the code difference between the first digital control code and the third digital control code; a second circuit input configured to receive a first pseudorandom binary sequence; a code modification circuit configured to modify the binary difference sequence based on the first pseudorandom binary sequence in order to obtain a modified binary difference sequence; an accumulator circuit configured to add the modified binary difference sequence to a preceding shift code in order to obtain the shift code; a circuit output configured to sequentially output the preceding shift code and the shift code.

Example 5 is the DAC of example 4, wherein the code modification circuit is a first multiplier circuit configured to multiply the binary difference sequence with the first pseudorandom binary sequence in order to obtain the modified binary difference sequence.

Example 6 is the DAC of example 4, wherein the code modification circuit comprises: a first adder circuit configured to add a first constant value to each bit of the first pseudorandom binary sequence in order to obtain a modified first pseudorandom binary sequence; and a first multiplier circuit configured to multiply the binary difference sequence and the modified first pseudorandom binary sequence in order to obtain the modified binary difference sequence.

Example 7 is the DAC of example 6, wherein the first constant value is −1.

Example 8 is the DAC of any of examples 4 to 7, wherein the accumulator circuit comprises: a second adder circuit configured to add the modified binary difference sequence to preceding shift code in order to obtain the shift code; and a delay element coupled between the circuit output and the first adder circuit, wherein the delay element is configured to delay and subsequently supply the preceding shift code to the first adder circuit.

Example 9 is the DAC of any of examples 4 to 8, wherein the shift code generation circuit further comprises: a third circuit input configured to receive a second pseudorandom binary sequence; a fourth circuit input configured to receive a digital value; a range restriction circuit configured to: receive the digital value and the second pseudorandom binary sequence; modify the second pseudorandom binary sequence by restricting a value represented by the second pseudorandom binary sequence to a value range defined by the digital value in order to obtain a modified second pseudorandom binary sequence; and output the modified second pseudorandom binary sequence; a polarity modification circuit configured to modify a polarity of the modified second pseudorandom binary sequence based on the first pseudorandom binary sequence in order to obtain a random shift sequence; and a first combiner circuit configured to: modify the shift code by combining the shift code and the random shift sequence; or modify the modified binary difference sequence by combining the modified binary difference sequence and the random shift sequence.

Example 10 is the DAC of example 9, the polarity modification circuit comprises: a second multiplier circuit configured to multiply each bit of the first pseudorandom binary sequence with a second constant value in order to obtain a multiplied first pseudorandom binary sequence; a third adder circuit configured to add a third constant value to each bit of the multiplied first pseudorandom binary sequence in order to obtain a modification sequence; and a second combiner circuit configured to modify the polarity of the modified second pseudorandom binary sequence based on the modification sequence in order to obtain the random shift sequence.

Example 11 is the DAC of example 10, wherein the second constant value is 2, and wherein the third constant value −1.

Example 12 is the DAC of any of examples 9 to 11, wherein the first digital control code is a N-bit control code, and wherein the second pseudorandom binary sequence is a N-bit sequence.

Example 13 is the DAC of any of examples 4 to 12, wherein the first pseudorandom binary sequence is a 1-bit sequence.

Example 14 is the DAC of any of examples 4 to 13, further comprising: a pseudorandom number generator circuit configured to generate the first pseudorandom binary sequence.

Example 15 is the DAC of example 14, wherein the pseudorandom number generator circuit is further configured to generate the second pseudorandom binary sequence.

Example 16 is the DAC of example 14, further comprising: a second pseudorandom number generator circuit configured to generate the second pseudorandom binary sequence.

Example 17 is the DAC of any of examples 14 to 16, wherein the pseudorandom number generator circuit is linear-feedback shift register.

Example 18 is the DAC of any of examples 4 to 17, further comprising: a code difference determination circuit configured to determine, based on the first digital control code and the third digital control code, the binary difference sequence.

Example 19 is the DAC of example 18, wherein the code difference determination circuit comprises: a circuit input configured to subsequently receive the first digital control code and the third digital control code; a delay circuit configured to delay the third digital control code; and a subtractor circuit configured to subtract the delayed third digital control code from the first digital control code in order to obtain the binary difference sequence.

Example 20 is a DAC, comprising: an input configured to receive a first digital control code for controlling a plurality of DAC cells; a code difference determination circuit configured to determine, based on the first digital control code and a second digital control code, a binary difference sequence indicating a code difference between the first digital control code and the second digital control code; a first processing line configured to generate a first digital code based on the binary difference sequence, and to generate a second digital code based on the first digital code; a second processing line configured to generate a third digital code based on the binary difference sequence, and to generate a fourth digital code based on the third digital code; a logic circuit configured to combine the second digital code and the fourth digital code using two different logic combinations in order to obtain a third and a fourth digital control code; and an output circuit configured to selectively output one of the third and the fourth digital control code based on a comparison of the first digital code and the third digital code.

Example 21 is the DAC of example 20, wherein the input is configured to receive the second digital control code prior to the first digital control code.

Example 22 is the DAC of example 20 or example 21, wherein the first digital control code, the second digital control code, the first digital code and the third digital code are binary codes, and wherein the second digital code, the fourth digital code, the third digital control code and the fourth digital control code are unary codes.

Example 23 is the DAC of any of examples 20 to 22, wherein the first processing line comprises: a first combiner circuit configured to combine the binary difference sequence with a first pseudorandom binary sequence in order to obtain a first modified binary difference sequence; a multiplier circuit configured to multiply the first modified binary difference sequence with a constant value in order to obtain a second modified binary difference sequence; a first accumulator circuit configured to generate the first digital code based on the second modified binary difference sequence; a first code converter circuit configured convert the first digital code to a fifth digital code; and an inverter circuit configured to invert the fifth digital code in order to obtain the second digital code.

Example 24 is the DAC of example 25, wherein the first accumulator circuit is configured to generate the first digital code by adding the second modified binary difference sequence to a sixth digital code.

Example 25 is the DAC of example 23 or example 24, wherein the first processing line further comprises: a first adder circuit coupled between the multiplier circuit and the first accumulator circuit, wherein the first adder circuit is configured to modify the second modified binary difference sequence by adding a second pseudorandom binary sequence.

Example 26 is the DAC of any of examples 23 to 25, wherein the second processing line comprises: a second combiner circuit configured to combine the binary difference sequence with an inverse of the first pseudorandom binary sequence in order to obtain a third modified binary difference sequence; a second accumulator circuit configured to generate the third digital code based on the third modified binary difference sequence; and a second code converter circuit configured convert the third digital code to the fourth digital code.

Example 27 is the DAC of example 26, wherein the second accumulator circuit is configured to generate the third digital code by adding the third modified binary difference sequence to a seventh digital code.

Example 28 is the DAC of example 26 or example 27, wherein the second processing line further comprises: a second adder circuit coupled between the second combiner circuit and the second accumulator circuit, wherein the second adder circuit is configured to modify the third modified binary difference sequence by adding a second pseudorandom binary sequence.

Example 29 is the DAC of any of examples 23 to 28, further comprising: a pseudorandom number generator circuit configured to generate the first pseudorandom binary sequence.

Example 30 is the DAC of example 29, wherein the pseudorandom number generator circuit is linear-feedback shift register.

Example 31 is the DAC of example 29 or example 30, further comprising an inverter circuit coupled between the pseudorandom number generator circuit and the second combiner circuit, wherein the inverter circuit is configured to invert the first pseudorandom binary sequence.

Example 32 is the DAC of any of examples 23 to 31, wherein the pseudorandom number generator circuit is further configured to generate the second pseudorandom binary sequence, wherein the DAC further comprises a range restriction circuit coupled between the pseudorandom number generator circuit and each of the first processing line and the second processing line, and wherein the range restriction circuit is configured to: receive a digital value and the second pseudorandom binary sequence; and modify the second pseudorandom binary sequence by restricting a value represented by the second pseudorandom binary sequence to a value range defined by the digital value.

Example 33 is the DAC of any of examples 23 to 32, wherein the first pseudorandom binary sequence is a 1-bit sequence.

Example 34 is the DAC of any of examples 23 to 33, wherein the second pseudorandom binary sequence is a M-bit sequence with $M \geq 1$.

Example 35 is the DAC of any of examples 20 to 34, wherein the logic circuit comprises: an AND gate configured to generate the third digital control code based on the second digital code and the fourth digital code; and an OR gate configured to generate the fourth digital control code based on the second digital code and the fourth digital code.

Example 36 is the DAC of any of examples 20 to 35, wherein the output circuit comprises: a multiplexer configured to selectively output one of the third and the fourth digital control code based on a control signal; and a comparison circuit configured to generate the control signal based on the comparison of the first digital code and the third digital code.

Example 37 is the DAC of example 36, wherein the third and the fourth digital control code are N-bit codes, wherein the first digital code and the third digital code are N+1-bit codes, and wherein the comparison circuit is configured to exclusively compare the most significant bit of the first digital code to the most significant bit of the third digital code.

Example 38 is the DAC of example 37, wherein the comparison circuit comprises an XOR gate for comparing the most significant bit of the first digital code to the most significant bit of the third digital code.

Example 39 is the DAC of example 37 or example 38, wherein, if the most significant bit of the first digital code and the most significant bit of the third digital code exhibit different bit values, the comparison circuit is configured to generate the control signal such that the multiplexer outputs the third digital control code.

Example 40 is the DAC of example 38 or example 39, wherein, if the most significant bit of the first digital code and the most significant bit of the third digital code exhibit the same bit value, the comparison circuit is configured to generate the control signal such that the multiplexer outputs the fourth digital control code.

Example 41 is the DAC of any of examples 20 to 40, wherein the input is configured to receive the second digital control code prior to the first digital control code, and wherein the code difference determination circuit comprises: a delay circuit configured to delay the second digital control code; and a subtractor circuit configured to subtract the delayed second digital control code from the first digital control code in order to obtain the binary difference sequence.

Example 42 is the DAC of any of examples 20 to 41, further comprising: a cell activation circuit configured to selectively activate one or more of the plurality of DAC cells based on the one of the third and the fourth digital control code output by the output circuit, wherein each activated DAC cell is configured to output a respective cell output signal; and an output configured to output an analog output signal based on the cell output signals.

Example 43 is a transmitter, comprising: a DAC according to any of examples 1 to 42; and a digital circuit configured to supply the first digital control code to the input.

Example 44 is the transmitter of example 43, wherein the digital circuit is configured to generate the first digital control code based on data to be wirelessly transmitted.

Example 45 is a base station, comprising: a transmitter according to example 43 or example 44; and at least one antenna element coupled to the transmitter.

Example 46 is the base station of example 45, further comprising a receiver configured to receive a radio frequency receive signal from the antenna element.

Example 47 is a mobile device, comprising: a transmitter according to example 43 or example 44; and at least one antenna element coupled to the transmitter.

Example 48 is the mobile device of example 47, further comprising a receiver configured to receive a radio frequency receive signal from the antenna element.

Example 49 is a method for a DAC, comprising: receiving a first digital control code for controlling a plurality of DAC cells; converting the first digital control code to a second digital control code; generating a shift code based on a code difference between the first digital control code and a third digital control code; bit-shifting the second digital control code based on the shift code in order to obtain a modified second digital control code; selectively activating one or more of the plurality of DAC cells based on the modified second digital control code, wherein each activated DAC cell outputs a respective cell output signal; and outputting an analog output signal based on the cell output signals.

Example 50 is a method for a DAC, comprising: receiving a first digital control code for controlling a plurality of DAC cells; determining, based on the first digital control code and a second digital control code, a binary difference sequence indicating a code difference between the first digital control code and the second digital control code; generating a first digital code based on the binary difference sequence using a first processing line; generating a second digital code based on the first digital code using the first processing line; generating a third digital code based on the binary difference sequence using a second processing line; generating a fourth digital code based on the third digital code using the second processing line; combining the second digital code and the fourth digital code using two different logic combinations in order to obtain a third and a fourth digital control code; and selectively outputting one of the third and the fourth digital control code based on a comparison of the first digital code and the third digital code.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a signal", "means for generating a signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown.

Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or—steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A digital-to-analog converter, comprising:
    an input configured to receive a first digital control code for controlling a plurality of digital-to-analog converter cells;
    a code converter circuit configured to convert the first digital control code to a second digital control code;
    a shift code generation circuit configured to generate a shift code based on a code difference between the first digital control code and a third digital control code;
    a bit-shifter circuit configured to bit-shift the second digital control code based on the shift code in order to obtain a modified second digital control code;
    a cell activation circuit configured to selectively activate one or more of the plurality of digital-to-analog converter cells based on the modified second digital control code, wherein each activated digital-to-analog converter cell is configured to output a respective cell output signal; and
    an output configured to output an analog output signal based on the cell output signals.

2. The digital-to-analog converter of claim 1, wherein the input is configured to receive the third digital control code prior to the first digital control code.

3. The digital-to-analog converter of claim 1, wherein the first digital control code and the third digital control code are binary codes, and wherein the second digital control code is a unary code.

4. The digital-to-analog converter of claim 1, wherein the shift code generation circuit comprises:
    a first circuit input configured to receive a binary difference sequence indicating the code difference between the first digital control code and the third digital control code;
    a second circuit input configured to receive a first pseudorandom binary sequence;
    a code modification circuit configured to modify the binary difference sequence based on the first pseudorandom binary sequence in order to obtain a modified binary difference sequence;
    an accumulator circuit configured to add the modified binary difference sequence to a preceding shift code in order to obtain the shift code;
    a circuit output configured to sequentially output the preceding shift code and the shift code.

5. The digital-to-analog converter of claim 4, wherein the code modification circuit is a first multiplier circuit configured to multiply the binary difference sequence with the first pseudorandom binary sequence in order to obtain the modified binary difference sequence.

6. The digital-to-analog converter of claim 4, wherein the code modification circuit comprises:
    a first adder circuit configured to add a first constant value to each bit of the first pseudorandom binary sequence in order to obtain a modified first pseudorandom binary sequence; and
    a first multiplier circuit configured to multiply the binary difference sequence and the modified first pseudorandom binary sequence in order to obtain the modified binary difference sequence.

7. The digital-to-analog converter of claim 6, wherein the first constant value is −1.

8. The digital-to-analog converter of claim 4, wherein the accumulator circuit comprises:

a second adder circuit configured to add the modified binary difference sequence to preceding shift code in order to obtain the shift code; and a delay element coupled between the circuit output and the first adder circuit, wherein the delay element is configured to delay and subsequently supply the preceding shift code to the first adder circuit.

9. The digital-to-analog converter of claim 4, wherein the shift code generation circuit further comprises:

a third circuit input configured to receive a second pseudorandom binary sequence;

a fourth circuit input configured to receive a digital value;

a range restriction circuit configured to:
receive the digital value and the second pseudorandom binary sequence;
modify the second pseudorandom binary sequence by restricting a value represented by the second pseudorandom binary sequence to a value range defined by the digital value in order to obtain a modified second pseudorandom binary sequence; and
output the modified second pseudorandom binary sequence;

a polarity modification circuit configured to modify a polarity of the modified second pseudorandom binary sequence based on the first pseudorandom binary sequence in order to obtain a random shift sequence; and a first combiner circuit configured to:
modify the shift code by combining the shift code and the random shift sequence; or
modify the modified binary difference sequence by combining the modified binary difference sequence and the random shift sequence.

10. The digital-to-analog converter of claim 9, the polarity modification circuit comprises:

a second multiplier circuit configured to multiply each bit of the first pseudorandom binary sequence with a second constant value in order to obtain a multiplied first pseudorandom binary sequence;

a third adder circuit configured to add a third constant value to each bit of the multiplied first pseudorandom binary sequence in order to obtain a modification sequence; and a second combiner circuit configured to modify the polarity of the modified second pseudorandom binary sequence based on the modification sequence in order to obtain the random shift sequence.

11. The digital-to-analog converter of claim 10, wherein the second constant value is 2, and wherein the third constant value −1.

12. The digital-to-analog converter of claim 9, wherein the first digital control code is a N-bit control code, and wherein the second pseudorandom binary sequence is a N-bit sequence.

13. The digital-to-analog converter of claim 4, wherein the first pseudorandom binary sequence is a 1-bit sequence.

14. The digital-to-analog converter of claim 4, further comprising:

a pseudorandom number generator circuit configured to generate the first pseudorandom binary sequence.

15. The digital-to-analog converter of claim 14, wherein the pseudorandom number generator circuit is further configured to generate the second pseudorandom binary sequence.

16. The digital-to-analog converter of claim 14, further comprising:

a second pseudorandom number generator circuit configured to generate the second pseudorandom binary sequence.

17. The digital-to-analog converter of claim 14, wherein the pseudorandom number generator circuit is linear-feedback shift register.

18. The digital-to-analog converter of claim 4, further comprising:

a code difference determination circuit configured to determine, based on the first digital control code and the third digital control code, the binary difference sequence.

19. The digital-to-analog converter of claim 18, wherein the code difference determination circuit comprises:

a circuit input configured to subsequently receive the first digital control code and the third digital control code;

a delay circuit configured to delay the third digital control code; and a subtractor circuit configured to subtract the delayed third digital control code from the first digital control code in order to obtain the binary difference sequence.

20. A transmitter, comprising:
a digital-to-analog converter according to claim 1; and
a digital circuit configured to supply the first digital control code to the input.

21. The transmitter of claim 20, wherein the digital circuit is configured to generate the first digital control code based on data to be wirelessly transmitted.

22. A base station, comprising:
a transmitter according to claim 20; and
at least one antenna element coupled to the transmitter.

23. The base station of claim 22, further comprising a receiver configured to receive a radio frequency receive signal from the antenna element.

24. A method for a digital-to-analog converter, comprising:

receiving a first digital control code for controlling a plurality of digital-to-analog converter cells;

converting the first digital control code to a second digital control code;

generating a shift code based on a code difference between the first digital control code and a third digital control code;

bit-shifting the second digital control code based on the shift code in order to obtain a modified second digital control code;

selectively activating one or more of the plurality of digital-to-analog converter cells based on the modified second digital control code, wherein each activated digital-to-analog converter cell outputs a respective cell output signal; and outputting an analog output signal based on the cell output signals.

* * * * *